(12) United States Patent
Tanaka

(10) Patent No.: US 10,186,461 B2
(45) Date of Patent: Jan. 22, 2019

(54) SEMICONDUCTOR DEVICE MANUFACTURING METHOD

(71) Applicant: Mitsubishi Electric Corporation, Tokyo (JP)

(72) Inventor: Hiroshi Tanaka, Tokyo (JP)

(73) Assignee: Mistubishi Electric Corporation, Tokyo (JP)

( * ) Notice: Subject to any disclaimer, the term of this patent is extended or adjusted under 35 U.S.C. 154(b) by 0 days.

(21) Appl. No.: 15/692,999

(22) Filed: Aug. 31, 2017

(65) Prior Publication Data

US 2018/0166346 A1 Jun. 14, 2018

(30) Foreign Application Priority Data

Dec. 12, 2016 (JP) .................................. 2016-240488

(51) Int. Cl.
*H01L 21/66* (2006.01)
*H01L 21/306* (2006.01)
*H01L 21/02* (2006.01)

(52) U.S. Cl.
CPC ........ *H01L 22/12* (2013.01); *H01L 21/02019* (2013.01); *H01L 21/306* (2013.01); *H01L 22/26* (2013.01)

(58) Field of Classification Search
None
See application file for complete search history.

(56) References Cited

U.S. PATENT DOCUMENTS

| 5,399,299 A | 3/1995 | Stefani et al. |
| 2015/0118764 A1* | 4/2015 | Schwarzenbach ...... H01L 22/20 438/5 |
| 2017/0084505 A1* | 3/2017 | Seddon ............. H01L 23/49827 |

FOREIGN PATENT DOCUMENTS

| JP | S61-214430 A | 9/1986 |
| JP | H07-130812 A | 5/1995 |

* cited by examiner

*Primary Examiner* — Asok K Sarkar
(74) *Attorney, Agent, or Firm* — Studebaker & Brackett PC

(57) ABSTRACT

A semiconductor device manufacturing method includes setting a local target thickness of any one of a semiconductor wafer and a film formed on the semiconductor wafer as a material to be etched by calculating a local thickness based on a thickness of the material to be etched at an end point detection position, and subtracting a predetermined relative etch amount from the local thickness to determine the local target thickness, and etching the material to be etched while monitoring the thickness thereof at the end point detection position, and ending the etching when the thickness of the material to be etched at the end point detection position is determined to become the local target thickness or less.

12 Claims, 7 Drawing Sheets

→ Befor-processing representative value B2
→ Target thickness A1
→ After-processing representative value A2

| measured wafer thickness | | | | | wafer position | | | | |
|---|---|---|---|---|---|---|---|---|---|
| | max | min | mean | dev | 1 | 2 | 3 | ~ | 49 |
| pre-measurement | 101.2 | 99.2 | 100.2 | 0.32 | 100 | 100.2 | 100.4 | ~ | 99.9 |
| post-measurement | 81.3 | 79 | 80.1 | 0.35 | 80.2 | 80.3 | 80.5 | ~ | 79.9 |
| difference | 20.3 | 19.8 | 20.1 | 0.1 | 19.8 | 19.9 | 19.9 | ~ | 20 |

SEMICONDUCTOR DEVICE MANUFACTURING METHOD

BACKGROUND

Field

The present invention relates to a semiconductor device manufacturing method which etches a semiconductor wafer or a film formed on a semiconductor wafer as a material to be etched.

Background Art

Japanese Patent Application Publication No. H7-130812 discloses a technique in which a spatial etch rate pattern across the surface of a semiconductor wafer is inferred as a function of process conditions by using in situ ellipsometry in conjunction with statistical modeling methods.

In the case where a semiconductor wafer or a film formed on a semiconductor wafer is etched as a material to be etched, it is desired that a target thickness of the material to be etched after etching is equal to an after-processing representative value, which is a representative value of thicknesses of the material to be etched which are actually obtained after etching. In some cases, a specific position on the material to be etched is specified as an end point detection position, and an etching end point is detected by monitoring the thickness at the end point detection position during etching. In this etching method, if the thickness of the material to be etched at the end point detection position before etching is large, an etching amount until the target thickness is reached increases; if the thickness of the material to be etched is small, an etching amount until the target thickness is reached decreases.

In a method in which etching is performed until the thickness of the material to be etched at the end point detection position reaches the target thickness, in-plane variations in the thickness of the material to be etched is not taken into account. Specifically, if the material to be etched at the end point detection position is thicker than other portions of the material to be etched, the etching amount becomes too large, and an after-processing representative value becomes smaller than the target thickness. On the other hand, if the material to be etched at the end point detection position is thinner than other portions of the material to be etched, the etching amount becomes too small, and the after-processing representative value becomes larger than the target thickness.

SUMMARY

The present invention has been accomplished to solve the above-described problem, and an object of the present invention is to provide a semiconductor device manufacturing method capable of reducing an error between a target thickness of a material to be etched after etching and an after-processing representative value, the after-processing representative value being a representative value of thicknesses of the material to be etched which are actually obtained after etching.

In some examples, a semiconductor device manufacturing method includes setting a local target thickness of any one of a semiconductor wafer and a film formed on the semiconductor wafer as a material to be etched by calculating a local thickness based on a thickness of the material to be etched at an end point detection position, and subtracting a predetermined relative etch amount from the local thickness to determine the local target thickness, and etching the material to be etched while monitoring the thickness thereof at the end point detection position, and ending the etching when the thickness of the material to be etched at the end point detection position is determined to become the local target thickness or less.

Other and further objects, features and advantages of the invention will appear more fully from the following description.

DETAILED DESCRIPTION

Semiconductor device manufacturing methods according to embodiments of the present invention will be described with reference to the drawings. The same or corresponding components will be denoted by the same reference signs, and the repetition of explanation thereof may be omitted.

Embodiment 1

A semiconductor device manufacturing method according to Embodiment 1 uses a semiconductor wafer or a film formed on a semiconductor wafer as a material to be etched, and etches the material to be etched. The semiconductor device manufacturing method according to Embodiment 1 performs a target setting step first, and then performs an etching step.

Figure 1:
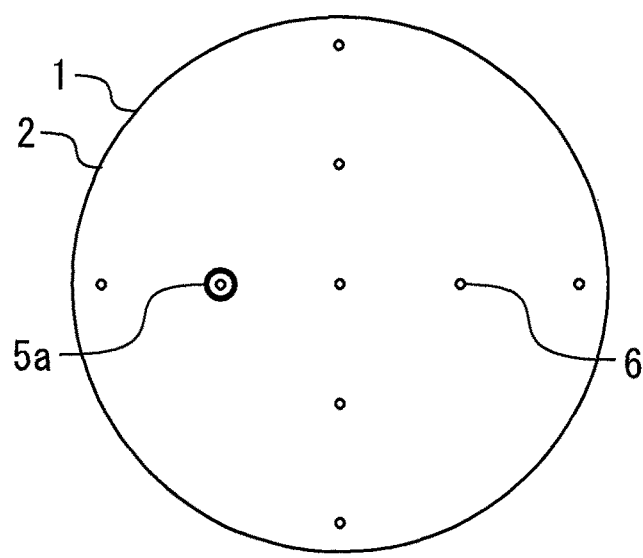
FIG. 1 shows an end point detection position on a material to be etched.

The target setting step will be described. In the target setting step, first, a local thickness is calculated based on the thickness of the material to be etched at an end point detection position. FIG. 1 shows an end point detection position 5a on a material to be etched 2, which is a semiconductor wafer 1 or a film formed on the semiconductor wafer 1. In the case where the semiconductor wafer 1 is the material to be etched 2, the semiconductor wafer 1 is, for example, a Si wafer, and the Si wafer itself is the material to be etched 2. FIG. 1 shows an example which includes nine measurement points 6 for calculating a before-processing representative value and an after-processing representative value, which will be described later, on the surface of the semiconductor wafer 1. One of the nine measurement points coincides with the end point detection position 5a. The measurement points 6 are formed in a vertical line and in a horizontal line to be arranged in a cross shape as a whole. A local thickness, which is the thickness of the material to be etched 2 at the end point detection position 5a, is calculated by a publicly-known method.

In one method of measuring the thickness of the material to be etched 2, the material to be etched 2 is irradiated with light having a wavelength which allows the light to pass through the material to be etched 2, and the thickness of the material to be etched is measured based on the intensity of interfering light reflected from the top and bottom of the material to be etched 2 and the refractive index. Moreover, in one method used in the case where light having a wavelength which allows the light to pass through the material to be etched 2 cannot be used, the material to be etched 2 is irradiated with light which does not have the property of passing through the material to, be etched 2, and the thickness of the material to be etched 2 which has been etched is measured based on the intensity of interfering light produced by the optical path difference between the path taken by light reflected from a portion protected from etching by resist or the like and the path taken by light reflected from an etched portion.

Figure 2:
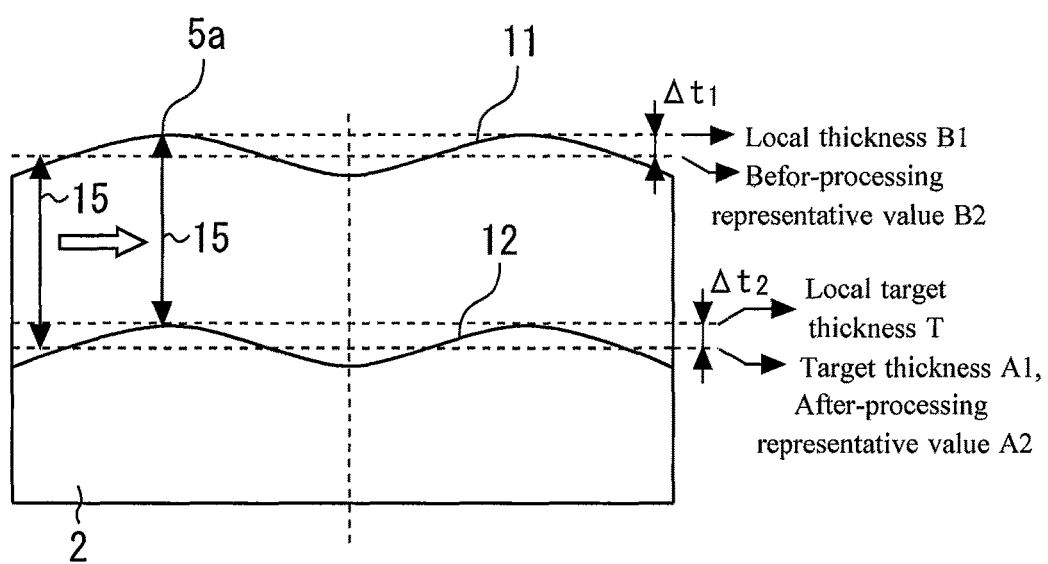
FIG. 2 is a cross-sectional view of the material to be etched.

FIG. 2 is a cross-sectional view of the material to be etched 2. FIG. 2 shows a surface 11 of the material to be etched 2 before etching and a surface 12 of the material to be etched 2 after etching. The thickness of the material to be etched 2 varies according to the processing accuracy of the preceding step. In the example shown in FIG. 2, the thickness of the material to be etched 2 is relatively large at the end point detection position 5a. The thickness of the material to be etched 2 at the end point detection position 5a on the surface 11 is a local thickness B1. A before-processing representative value B2 is a value representing thicknesses measured at a plurality of positions on the surface 11 before etching, e.g., a mean of thicknesses of the material to be etched 2 at the nine measurement points 6 in FIG. 1 before etching. The before-processing representative value B2 may be any value representing thicknesses of the material to be etched 2 which is determined based on thicknesses of the material to be etched 2 at a plurality of positions in or before the target setting step, and is not necessarily limited to a mean.

A relative etch amount 15 is calculated in or before the target setting step by subtracting a target thickness A1 of the material to be etched 2 after etching from the before-processing representative value B2. The target thickness A1 is an ideal thickness throughout the material to be etched 2 after etching. As the relative etch amount 15, for example, a predetermined relative etch amount may be used as it is. An after-processing representative value A2, which is a value representing thicknesses measured at a plurality of positions on the surface 12 after etching, is optional but effective in judging a result. For example, the after-processing representative value A2 is a mean of thicknesses of the material to be etched 2 at the nine measurement points 6 in FIG. 1 after etching. The after-processing representative value A2 may be any value representing thicknesses of the material to be etched 2 which is determined based on thicknesses of the material to be etched 2 at a plurality of positions after processing, and is not necessarily limited to a mean.

A local target thickness T is a thickness for detecting an etching end point at the end point detection position 5a, which is necessary for reducing an error between the target thickness A1 and the after-processing representative value A2. In the target setting step, the local target thickness T is calculated by calculating the local thickness B1 and then subtracting the predetermined relative etch amount 15 from the local thickness B1 by the aforementioned calculation method.

Subsequently, the etching step is performed. In the etching step, while the thickness of the material to be etched 2 at the end point detection position 5a is being monitored, the material to be etched 2 is etched. When it is determined that the thickness of the material to be etched 2 at the end point detection position 5a has become the local target thickness T or less, the etching end point is considered as having been reached, and etching is ended. By performing the etching step, the surface 11 of the material to be etched 2 in FIG. 2 is etched to the surface 12.

As the uniformity of etching improves, the shape of the surface 11 and the shape of the surface 12 become more similar. Specifically, as shown in FIG. 2, the difference $\Delta t1$ between the local thickness B1 and the before-processing representative value B2 becomes almost equal to the difference $\Delta t2$ between the local target thickness T and the after-processing representative value A2. Etching causes the material to be etched 2 to be etched by a thickness almost equal to the relative etch amount 15 everywhere on the material to be etched 2, and an error between the target thickness A1 and the after-processing representative value A2 can be reduced.

If in the etching step etching is performed until the thickness of the material to be etched 2 at the end point detection position 5a becomes the target thickness A1, the after-processing representative value A2 becomes smaller than the target thickness A1. Accordingly, an error between the target thickness A1 and the after-processing representative value A2 cannot be reduced. However, in the semiconductor device manufacturing method according to Embodiment 1, an error between the target thickness A1 and the after-processing representative value A2 can be reduced by setting the local target thickness T.

The semiconductor device manufacturing method according to Embodiment 1 can be variously modified within a range in which features thereof are not lost. For example, the arrangement of the measurement points 6 and the end point detection position 5a can be appropriately changed. Moreover, the difference between the after-processing representative value and the target thickness A1 may be determined by measuring thicknesses of the material to be etched at a plurality of positions after the etching step and calculating an after-processing representative value of thicknesses of the material to be etched based on the measured thicknesses. Moreover, at least any one of maximum value, minimum value, mean, and standard deviation may be determined for thicknesses of the material to be etched measured at a plurality of positions in or before the target setting step and thicknesses of the material to be etched measured at a plurality of positions after the etching step, or difference values at a plurality of positions obtained by subtraction. Moreover, thicknesses of the material to be etched may be weighted according to the distance from the center of the semiconductor wafer when the before-processing representative value B2 is calculated.

The material to be etched may be or contain Si, may be or contain C, or may be or contain metal. The material to be etched may be, for example, Si, $SiO_2$, SiON, SiN, C, SiC, SiOC, SiCN, Al, AlCu, Cu, Ti, Ni, Pt, GaN, or the like. In the etching step, a publicly-known etching technique such as dry etching or wet etching is used. These modifications can be appropriately applied to semiconductor device manufacturing methods according to another embodiments.

Embodiment 2

Figure 3:
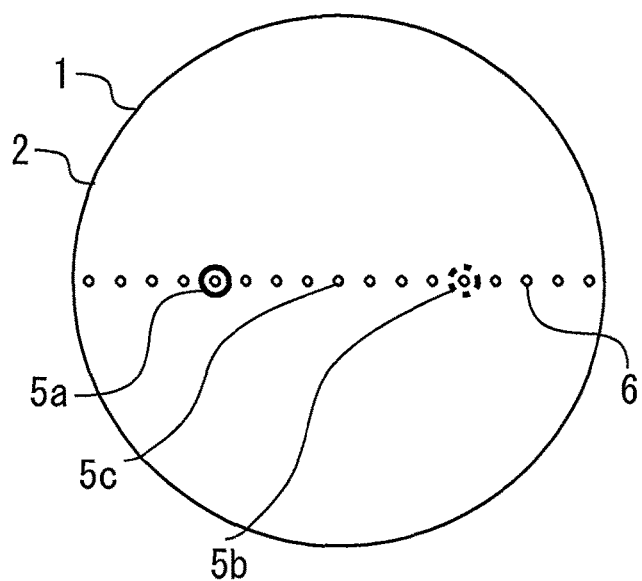
FIG. 3 shows the end point detection position and the like in Embodiment 2.

A semiconductor device manufacturing method according to Embodiment 2 has many things in common with that of Embodiment 1, and therefore differences from Embodiment 1 will be mainly described. FIG. 3 shows the end point detection position 5a and the like in Embodiment 2. A center 5c is a central position on the semiconductor wafer. A plurality of measurement points 6 are arranged in a line on a straight line passing through the center 5c. Some of the plurality of measurement points 6 coincide with the end point detection position 5a, the center 5c, and a symmetric position 5b. The symmetric position 5b is symmetric to the end point detection position 5a about the center 5c of the semiconductor wafer. In other words, the symmetric position 5b and the end point detection position 5a are point-symmetric about the center 5c of the semiconductor wafer.

In the target setting step of Embodiment 2, thicknesses of the material to be etched at the end point detection position 5a and the symmetric position 5b are measured, and a mean of the thicknesses is calculated as a local thickness. Then, a predetermined relative etch amount is subtracted from the local thickness, thus calculating a local target thickness.

Figure 4:
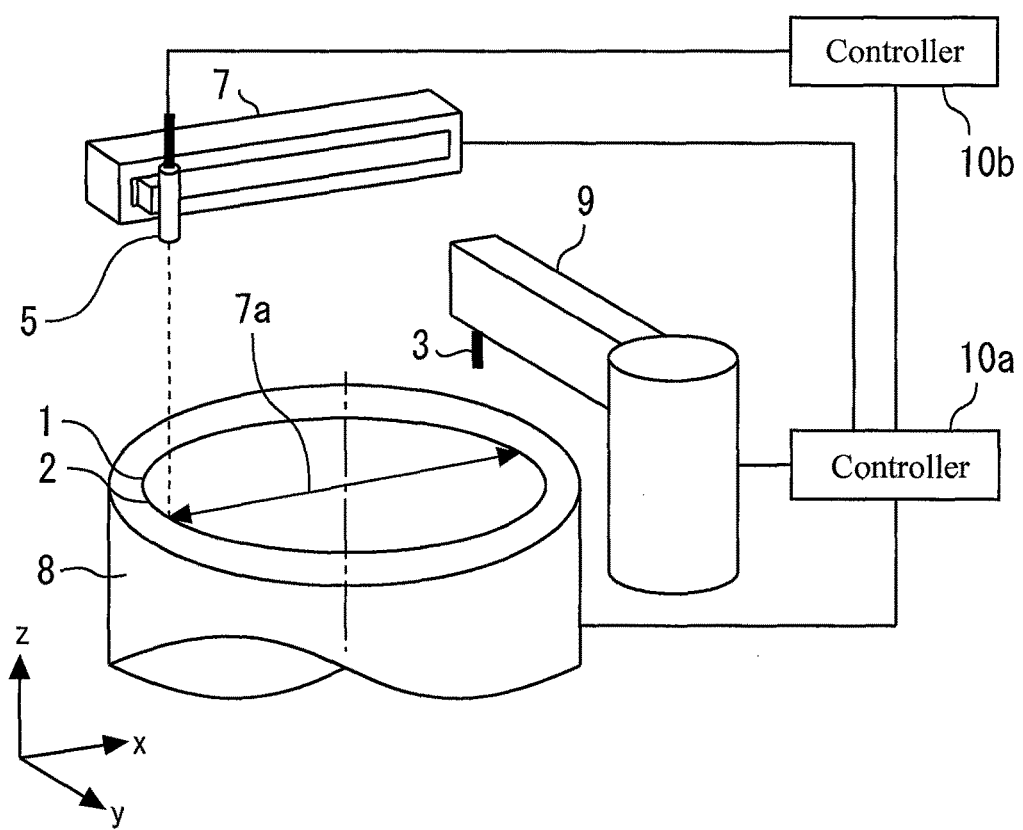
FIG. 4 shows an example of an apparatus configuration in Embodiment 2.

FIG. 4 shows an example of an apparatus configuration in Embodiment 2. The semiconductor wafer 1 is mounted on a stage 8 positioned at the origin of rotation. A thickness gauge sensor 5 is provided above the stage 8 to be capable of being moved by a scanning mechanism 7. A bidirectional arrow 7a indicates a range in which the operation of the scanning mechanism 7 allows measurement with the thickness gauge sensor 5. A nozzle scan arm 9 having an etchant ejection nozzle 3 is shown next to the stage 8. The thickness gauge sensor 5, the scanning mechanism 7, the nozzle scan arm 9, and the stage 8 are controlled by a managing controller 10a to measure thicknesses of the material to be etched 2 using the thickness gauge sensor 5 alone or in combination with the scanning mechanism 7 or the stage 8 and perform an etching process using the nozzle scan arm 9 and the stage 8.

The measurement of a thickness of the material to be etched 2 in FIG. 3 is performed as follows: the managing controller 10a controls the scanning mechanism 7 to position the thickness gauge sensor 5 at a measurement position and instruct a thickness gauge controller 10b to perform measurement; and the thickness gauge controller 10b measures a thickness of the material to be etched 2 based on the intensity of interfering light and the refractive index and returns a thickness value to the managing controller 10a. This operation is performed for each of the measurement points 6, the end point detection position 5a, and the symmetric position 5b. In the target setting step, the managing controller 10a calculates as a local thickness a mean of thicknesses at the end point detection position 5a and the symmetric position 5b which have been obtained by the above-described thickness measurement.

Moreover, the managing controller 10a calculates a before-processing representative value, which is a representative value of the thicknesses at the plurality of measurement points 6 obtained by the above-described thickness measurement. The before-processing representative value is, for example, a mean of the thicknesses of the material to be etched 2 at the plurality of measurement points 6. Of course, it is not a problem that the end point detection position 5a and the symmetric position 5b coincide with some of the plurality of measurement points 6.

Figure 5:
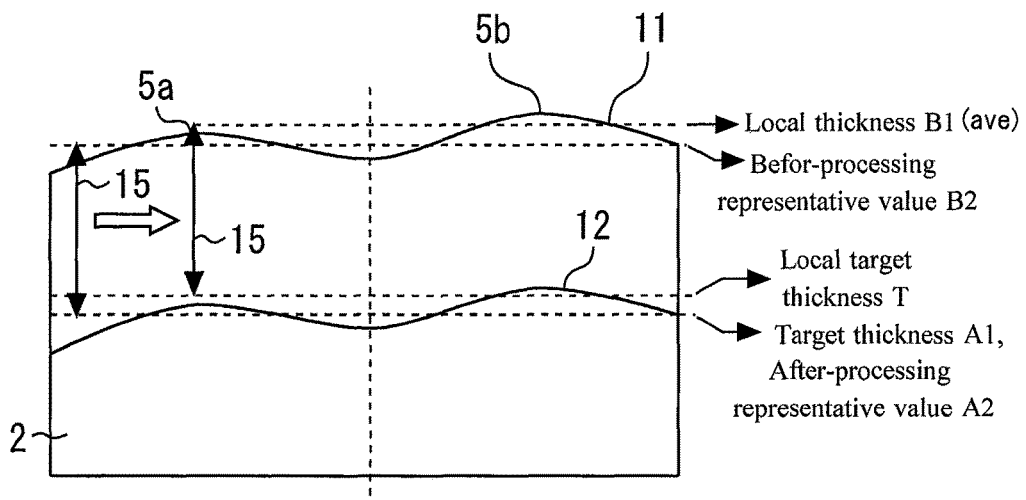
FIG. 5 is a cross-sectional view of the material to be etched.

FIG. 5 is a cross-sectional view of the material to be etched 2. On the surface 11, the thickness of the material to be etched 2 at the end point detection position 5a is smaller than the thickness of the material to be etched 2 at the symmetric position 5b. The local thickness B1 is a mean of thicknesses of the material to be etched 2 at the end point detection position 5a and the symmetric position 5b. The before-processing representative value B2 is smaller than the local thickness B1.

The relative etch amount 15 is calculated in or before the target setting step by subtracting a target thickness A1 of the material to be etched after etching from the before-processing representative value B2. The calculating operation is performed by the managing controller 10a. The target thickness A1 is often a value predetermined in a recipe or the like in advance, but, of course, a function of automatically selecting one of a plurality of recipes in which different target thicknesses A1 are set according to the range of the before-processing representative value B2 may also be used. In the target setting step, the local target thickness T is calculated by subtracting the relative etch amount 15 from the local thickness B1 as shown in FIG. 5.

Figure 6:
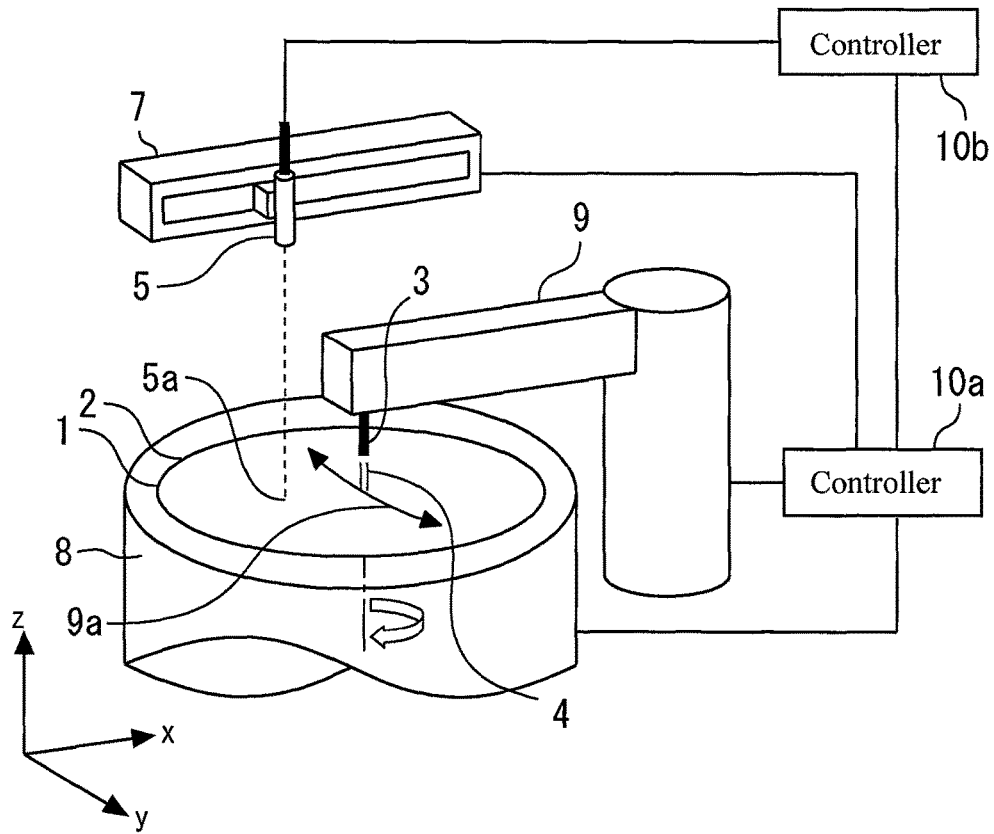
FIG. 6 is a view showing the operation of the apparatus in the etching.

In the etching step, single-wafer wet etching is performed on the material to be etched 2. FIG. 6 is a view showing the operation of the apparatus in the etching step. In the etching step, while the thickness of the material to be etched 2 at the end point detection position 5a is being monitored with the thickness gauge sensor 5, etchant is supplied from the nozzle 3 of the nozzle scan arm 9 to the material to be etched 2 with the semiconductor wafer 1 rotated by the stage 8. While the material to be etched 2 is being wet-etched by supplying etchant, the nozzle 3 is scanned by the scanning motion 9a of the nozzle scan arm 9 by the rotational reciprocating motion. Then, a mean of thicknesses at positions closest to the origin of rotation and a position of 180° among thicknesses of the material to be etched 2 at the end point detection position 5a continuously returned by the thickness gauge controller 10b is continuously calculated. When the mean is determined to become the local target thickness T or less, the managing controller 10a detects an etching end point and ends etching. After that, the stage 8 returns to the origin of rotation.

By the etching process, the surface 11 in FIG. 5 retreats to the surface 12. After the etching process, thicknesses of the material to be etched 2 are measured with the thickness gauge sensor 5 by driving the scanning mechanism 7. Specifically, thicknesses of the material to be etched 2 are measured in the range indicated by the bidirectional arrow in FIG. 4 to obtain thicknesses of the material to be etched 2 at all the measurement points 6 in FIG. 3. The after-processing representative value A2 is calculated based on the measured thicknesses. FIG. 5 shows a situation in which the after-processing representative value A2 becomes almost equal to the target thickness A1. By obtaining the after-processing representative value A2, it becomes possible to extract the difference between the after-processing representative value A2 and the target thickness A1 and extract at least one of maximum value, minimum value, mean, and standard deviation for thickness values at a plurality of positions on the wafer measured before and after etching or difference values at a plurality of positions obtained by subtraction. These values can be used in etching quality control.

Figure 7:
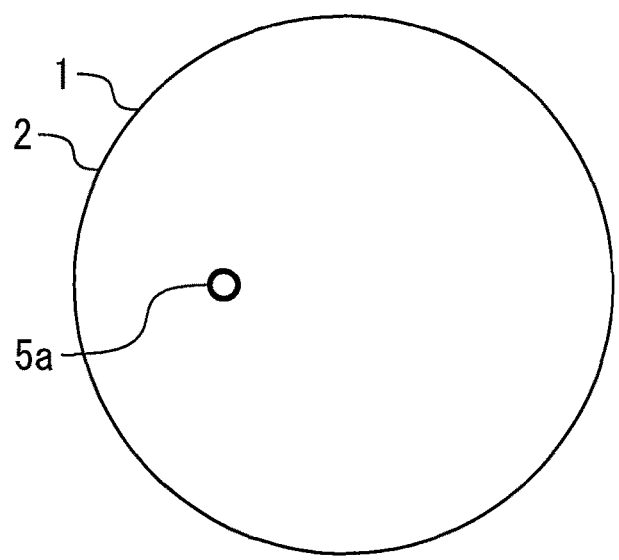
FIG. 7 is a view showing the end point detection position in the comparative example.
Figure 8:
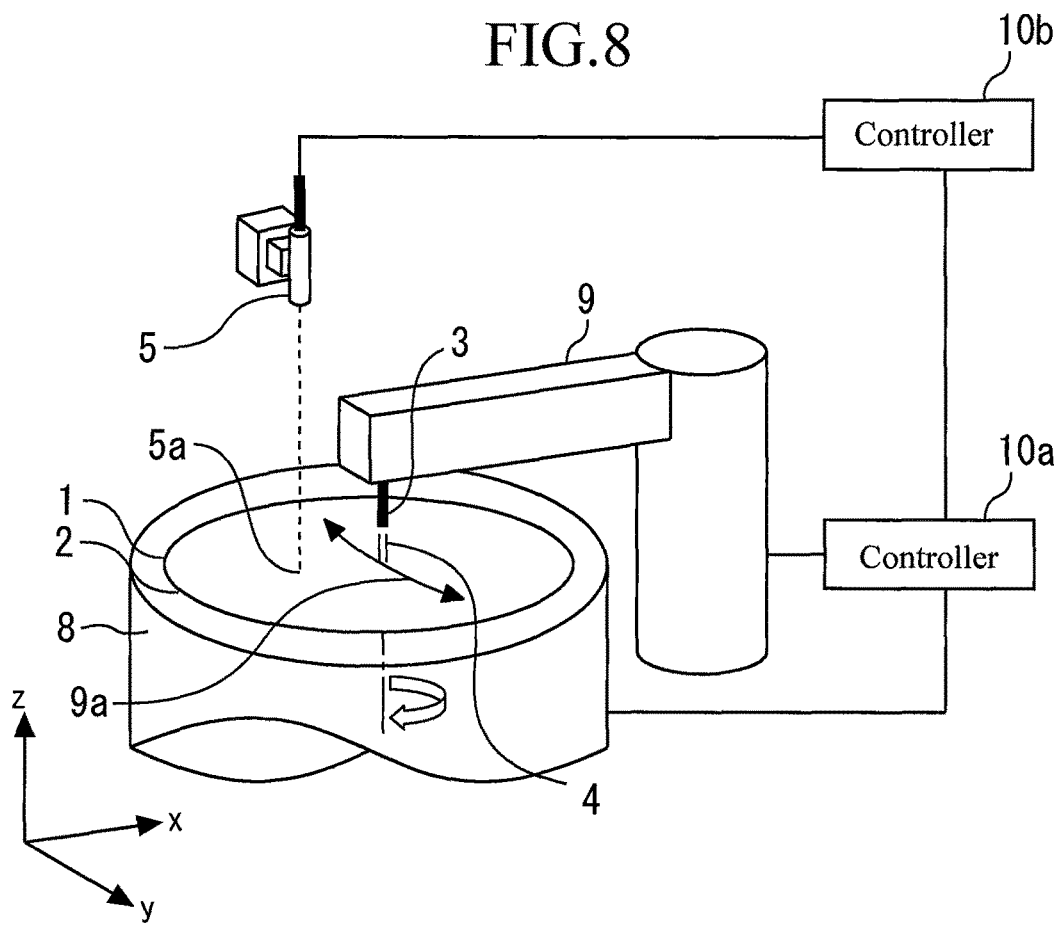
FIG. 8 is a view for explaining an etching in the comparative example.

To facilitate the understanding of the significance of the semiconductor device manufacturing method according to Embodiment 2, a comparative example will be described. In the explanation of the comparative example, differences from Embodiment 2 will be mainly described. FIG. 7 is a view showing the end point detection position 5a in the comparative example. It is important that the end point detection position 5a is provided at a position representing thicknesses of the material to be etched. FIG. 8 is a view for explaining an etching step in the comparative example. In the comparative example, while the thickness of the material to be etched 2 at the end point detection position 5a is being monitored with the thickness gauge sensor 5, the material to be etched 2 is etched by rotating the semiconductor wafer 1 and ejecting etchant from the nozzle 3 to the material to be etched 2. In the comparative example, the material to be etched 2 is etched by single-wafer wet etching.

In a reaction-limited system, etching conditions which produce favorable uniformity can be easily found even if the nozzle 3 is fixed to a position approximately directly above the center of the semiconductor wafer 1. However, in a supply-limited system, favorable etching uniformity cannot be realized unless etchant 4 ejected from the nozzle 3 is spread over the entire surface of the material to be etched 2 in a well-balanced manner by the scanning motion 9a of the arm. To improve etching uniformity in a supply-limited system, it is necessary to optimize the etch rate and flow rate of the etchant, the number of revolutions of the semiconductor wafer, and the scanning motion 9a of the nozzle 3. Further, to stabilize etching uniformity, fluctuations in the etch rate caused by the deterioration of the etchant 4 need to be reduced by taking measures such as replenishing components of the etchant.

In the comparative example, since the semiconductor wafer 1 is rotated with the end point detection position 5a fixed in place, an end point is detected on a circle at a distance from the center of rotation of the semiconductor wafer 1. It is important that the end point detection position 5a on the circle is a position representing thicknesses of the material to be etched 2. Moreover, the stability of the in-plane distribution of thicknesses of the material to be etched 2 and etching uniformity need to be kept good.

Figures 9, 10:
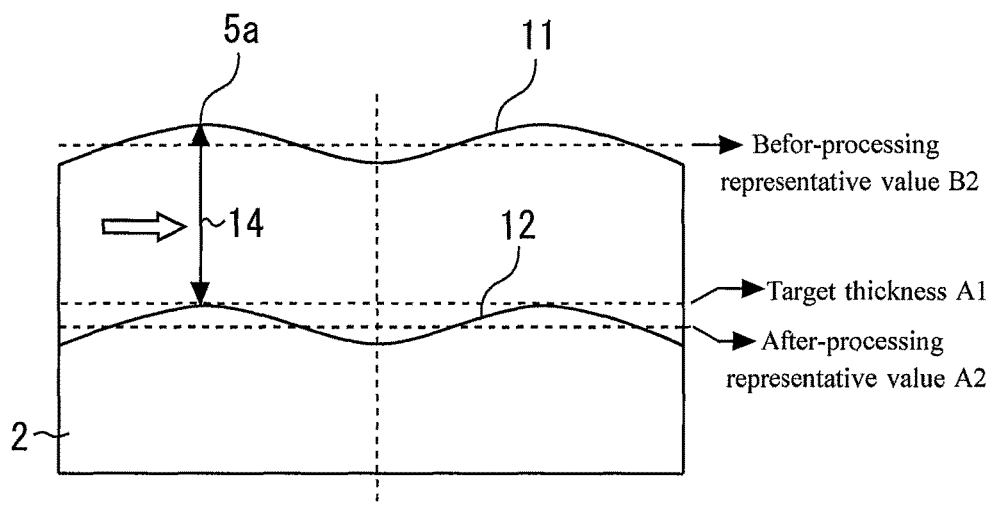
FIG. 9 is a cross-sectional view of the material to be etched in the comparative example.
FIG. 10 is a view showing an example of measurement values of thicknesses of a Si wafer before and after etching.

FIG. 9 is a cross-sectional view of the material to be etched 2 in the comparative example. In the comparative example, etching is performed until the thickness of the material to be etched 2 at the end point detection position 5a reaches the target thickness A1. Specifically, etching is performed by an etch amount 14. Accordingly, if the thickness of the material to be etched 2 at the end point detection position 5a on the surface 11 is deviated from the before-processing representative value B2, an error between the target thickness A1 and the after-processing representative value A2 cannot be reduced. FIG. 9 shows a situation in which etching is excessively performed to make the after-processing representative value A2 smaller than the target thickness A1 because the thickness of the material to be etched 2 at the end point detection position 5a before etching is larger than the before-processing representative value B2. In the case of the comparative example, if there is a large gap between the thickness of the material to be etched 2 at the end point detection position 5a before etching and the before-processing representative value B2, an error between the target thickness A1 and the after-processing representative value A2 cannot be reduced.

However, the semiconductor device manufacturing methods according to Embodiments 1 and 2 are not intended to realize the target thickness A1 at the end point detection position 5a but to set the local target thickness T, which is a thickness to be realized at the end point detection position 5a to reduce an error between the target thickness A1 and the after-processing representative value A2. In Embodiment 2, the local target thickness T is calculated by subtracting the relative etch amount 15 from the local thickness B1, which is a mean of thicknesses of the material to be etched 2 at the end point detection position 5a and the symmetric position 5b. Accordingly, in the case where the thickness of the material to be etched 2 has a slope as shown in the cross-sectional view in FIG. 5, an error between the target thickness A1 and the after-processing representative value A2 can be reduced further than in the case where a local thickness is defined based on only the thickness at the end point detection position 5a.

FIG. 10 is a view showing an example of measurement values of thicknesses of a Si wafer before and after etching. Pre-measurement means measurement before etching, and post-measurement means measurement after etching. From results of measurement at 49 points on the surface of the wafer, it can be seen that there are some variations in the thickness of the wafer before and after etching. Accordingly, it is preferred that a local thickness is determined based on measurement values at a plurality of positions as in Embodiment 2.

Embodiment 3

Figure 11:
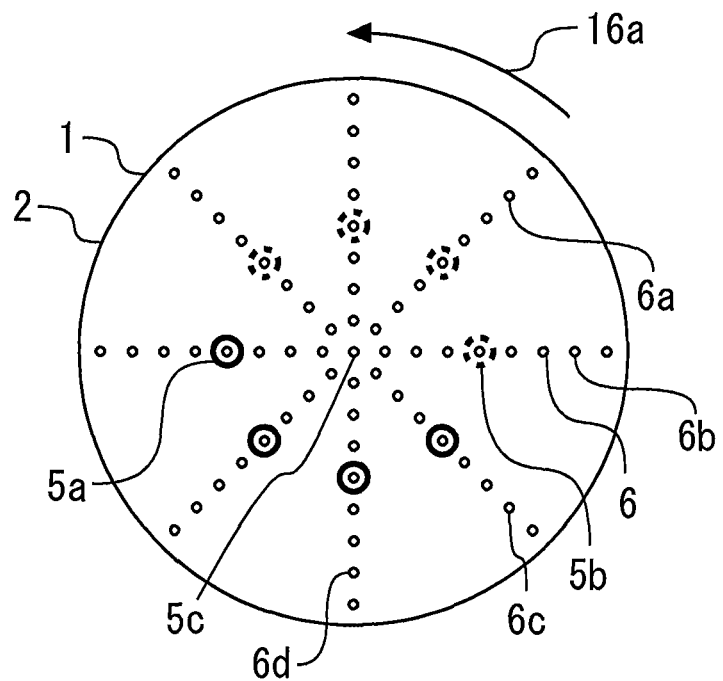
FIG. 11 shows the end point detection position and the like in Embodiment 3.

A semiconductor device manufacturing method according to Embodiment 3 has many things in common with that of Embodiment 2, and therefore differences from Embodiment 2 will be mainly described. FIG. 11 shows the end point detection position 5a and the like in Embodiment 3. In Embodiment 3, the measurement of thicknesses at the end point detection position 5a, the symmetric position 5b, and the measurement points 6 described in Embodiment 2 is performed four times with a pitch rotation 16a of, for example, 45°. There are thicknesses at the end point detection position 5a, the symmetric position 5b, and the measurement points 6 for four times of measurement, and the measurement points 6 include a plurality of measurement points 6a provided in a straight line, a plurality of measurement points 6b provided in a straight line, a plurality of measurement points 6c provided in a straight line, and a plurality of measurement points 6d provided in a straight line. Of course, it is not a problem that one end point detection position 5a, the center 5c, and one symmetric position 5b coincide with some of the plurality of measurement points 6a. This is true for the measurement points 6b, 6c, and 6d.

In the target setting step of Embodiment 3, a local thickness is calculated with a predetermined pitch rotation 16a of 45° of the semiconductor wafer 1, and a relative etch amount is subtracted from the local thickness. In Embodiment 3, thicknesses at the plurality of measurement points 6a arranged in a straight line are measured with the thickness gauge sensor 5 shown in FIG. 4 in a state in which the stage 8 having the semiconductor wafer 1 mounted thereon is positioned at the origin of rotation, and a mean of the thicknesses of the material to be etched 2 at the end point detection position 5a and the symmetric position 5b, each of which coincides with one of the measurement points 6a, is calculated as a local thickness. Further, the semiconductor wafer 1 is rotated by a rotation angle of 45°, thicknesses at the plurality of measurement points 6b arranged in a straight line are measured, and a mean of the thicknesses of the material to be etched 2 at the end point detection position 5a and the symmetric position 5b, each of which coincides with one of the measurement points 6b, is calculated as a local thickness.

Further, the semiconductor wafer 1 is rotated by a rotation angle of 45°, thicknesses at the plurality of measurement points 6c arranged in a straight line are measured, and a mean of the thicknesses of the material to be etched 2 at the end point detection position 5a and the symmetric position 5b, each of which coincides with one of the measurement points 6c, is calculated as a local thickness. Finally, the semiconductor wafer 1 is rotated by a rotation angle of 45°, thicknesses at the plurality of measurement points 6d arranged in a straight line are measured, and a mean of the thicknesses of the material to be etched 2 at the end point detection position 5a and the symmetric position 5b, each of which coincides with one of the measurement points 6d, is calculated as a local thickness.

In this way, four local thicknesses at different positions are calculated. Then, the relative etch amount is subtracted from each of the four local thicknesses, and a mean of the values obtained by subtraction is calculated as the local target thickness T. In other words, four local target thicknesses are determined, and then a mean of those values is calculated as the local target thickness T for use in the etching step. The local target thickness obtained by averaging a plurality of local target thicknesses is referred to as a mean local target thickness. The four thicknesses obtained at the end point detection positions 5a and the four thicknesses obtained at the symmetric positions 5b are thicknesses at positions located at the same distance from the center 5c, and the mean local target thickness has a value reflecting thicknesses at eight positions arranged in a circular pattern.

The relative etch amount 15 is calculated by calculating representative values of thicknesses at the measurement points 6a, 6b, 6c, and 6d in or before the target setting step, respectively, then calculating a mean of those four representative values as the before-processing representative value, and subtracting the target thickness of the material to be etched after etching from the before-processing representative value.

In the etching step, while etching is being performed with the semiconductor wafer 1 rotated, thicknesses of an object to be etched are continuously measured at the end point detection position 5a. Then, a mean of thicknesses at positions closest to the origin of rotation and positions of 45°, 90°, 135°, 180°, 225°, 270°, and 315° among the thicknesses of the material to be etched 2 is continuously calculated. When the mean is determined to become the mean local target thickness or less, an etching end point is detected, and etching is ended. The semiconductor device manufacturing method according to Embodiment 3 can reduce an error between the target thickness A1 and the after-processing representative value A2 in the case where the distribution of thicknesses of an object to be etched has waviness.

Embodiment 4

Figure 12:
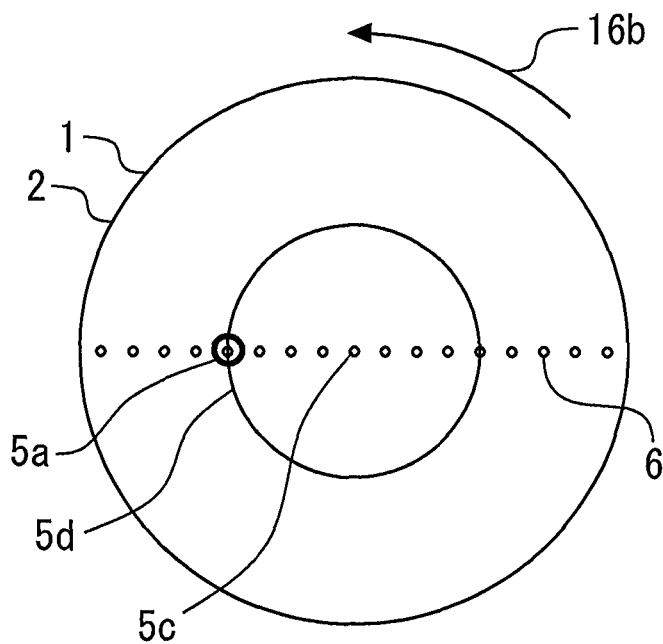
FIG. 12 shows an end point detection rotational trajectory.

A semiconductor device manufacturing method according to Embodiment 4 has many things in common with those of Embodiments 2 and 3, and therefore differences from Embodiments 2 and 3 will be mainly described. FIG. 12 shows an end point detection rotational trajectory 5d on which thicknesses can be captured at the end point detection position 5a by continuous rotation 16b, and the like. In the target setting step, a local thickness is measured while the semiconductor wafer 1 is being rotated. More specifically, while the semiconductor wafer 1 is being rotated, the thickness of the material to be etched 2 at the end point detection position 5a is measured at a plurality of measurement points for, for example, one revolution, and a local thickness representing thicknesses on the end point detection rotational trajectory 5d can be obtained by averaging, mode extraction, or the like. It should be noted that after the local target thickness T is calculated, the etching step can be immediately performed without stopping rotation.

The relative etch amount for use in the calculation of the local target thickness T is naturally calculated in or before the target setting step. The relative etch amount is calculated by, for example, calculating the before-processing representative value B2, which is a representative value of thicknesses of the material to be etched, based on thicknesses of the material to be etched 2 at a plurality of positions on a straight line passing through the center 5c and subtracting the target thickness A1 from the before-processing representative value B2.

Figure 13:
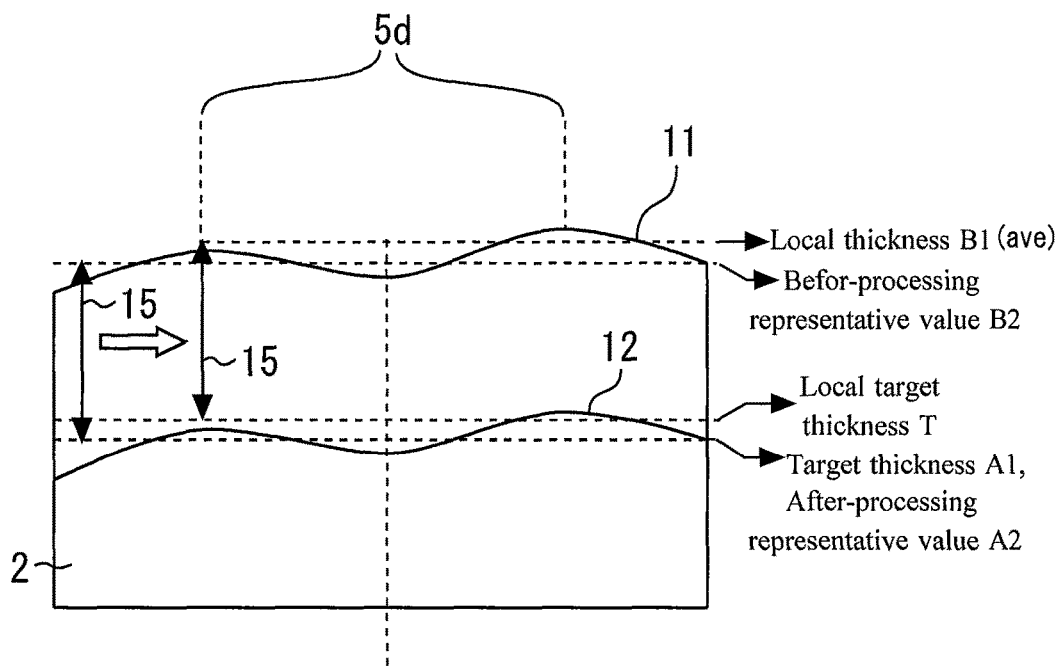
FIG. 13 shows the surfaces of the material to be etched before and after etching.

FIG. 13 shows the surface 11 of the material to be etched 2 before etching and the surface 12 of the material to be etched 2 after etching. The larger the waviness of thicknesses of the surface 11 is, the more greatly the local thickness varies according to measurement positions for thicknesses to be used to calculate the local thickness. In the etching step, since the semiconductor wafer 1 is rotated, the thickness of the material to be etched 2 on the end point detection rotational trajectory 5d is monitored during etching. Accordingly, the local thickness calculated before etching is preferably obtained by measurement on the end point detection rotational trajectory 5d. For this reason, in Embodiment 4, since the local thickness is calculated with the semiconductor wafer 1 rotated, the local thickness having different values according to the rotation angle of the semiconductor wafer 1 can be smoothed. Thus, an error between the target thickness A1 and the after-processing representative value A2 can be reduced.

In the target setting step and the etching step, thicknesses of the material to be etched 2 may be measured at a plurality of measurement points with the semiconductor wafer 1 rotated, and a mean thereof may be calculated as a local thickness, or a mode thereof may be calculated as a local thickness. Using the same method for both the measurement of film thicknesses in the target setting step and the measurement of film thicknesses in the etching step enables etching accurately reflecting the relative etch amount 15 and enables an error between the target thickness A1 and the after-processing representative value A2 to be reduced.

In all the above-described embodiments, a method of calculating the before-processing representative value B2 is not particularly limited. For example, the before-processing representative value B2 may be calculated by simply averaging thicknesses measured at a plurality of positions arranged at regular intervals on the surface of the wafer or averaging measurement values with the density of measurement points changed according to the distance from the wafer center or with measurement values weighted according to the distance from the wafer center.

In Embodiments 2 to 4, etching is performed while the semiconductor wafer 1 is being rotated. However, instead of ending etching when a mean of thicknesses of the material to be etched 2 which is continuously calculated becomes the local target thickness T or less only once, making a determination based on a thickness obtained by smoothing fluctuations in the thickness of the material to be etched 2 using a moving average makes it possible to reduce outliers of the thickness due to disturbance and the influence of waviness and to reduce an error between the target thickness A1 and the after-processing representative value A2. It should be noted that technical features of the above-described embodiments may be appropriately used in combination.

In accordance with the embodiments described herein, a target thickness itself of a material to be etched after etching is not used as a local target thickness. Instead, a local thickness is calculated based on a thickness of the material to be etched at an end point detection position, and a predetermined relative etch amount is subtracted from the local thickness, thus determining a local target thickness. Accordingly, the deviation of an after-processing representative value from the target thickness can be reduced by appropriately setting the relative etch amount. It should be noted that a method of appropriately setting the relative etch amount is disclosed in the present application. Many modifications and variations of the embodiments are possible in the light of the above teachings. It is therefore to be understood that within the scope of the appended claims variations may be practiced otherwise than as specifically described.

What is claimed is:

1. A semiconductor device manufacturing method comprising:
    setting a local target thickness of any one of a semiconductor wafer and a film formed on the semiconductor wafer as a material to be etched by calculating a local thickness based on a thickness of the material to be etched at an end point detection position, and subtracting a predetermined relative etch amount from the local thickness to determine the local target thickness; and
    etching the material to be etched while monitoring the thickness thereof at the end point detection position, and ending the etching when the thickness of the material to be etched at the end point detection position is determined to become the local target thickness or less.

2. The semiconductor device manufacturing method according to claim 1, wherein in the etching, etching is performed while the semiconductor wafer is being rotated.

3. The semiconductor device manufacturing method according to claim 1, wherein when setting the local target thickness, the local thickness is calculated based on thicknesses obtained for a plurality of positions at the end point detection position by rotating the semiconductor wafer.

4. The semiconductor device manufacturing method according to claim 1, wherein when setting the local target thickness, a mean of thicknesses of the material to be etched at the end point detection position and a symmetric position which is symmetric to the end point detection position about a center of the semiconductor wafer is calculated as the local thickness.

5. The semiconductor device manufacturing method according to claim 4, wherein when setting the local target thickness, an operation of calculating the local thickness and subtracting the relative etch amount from the local thickness is performed every time the semiconductor wafer is rotated by a predetermined rotation angle, and a mean of the plurality of values obtained by subtraction is calculated as the local target thickness.

6. The semiconductor device manufacturing method according to claim 5, wherein the relative etch amount is calculated by calculating a representative value of thicknesses of the material to be etched based on thicknesses at a plurality of positions on a straight line passing through the center of the semiconductor wafer every time the semiconductor wafer is rotated by the rotation angle, calculating a mean of the plurality of obtained representative values as a before-processing representative value, and subtracting a target thickness of the material to be etched after etching from the before-processing representative value.

7. The semiconductor device manufacturing method according to claim 1, wherein the relative etch amount is calculated in or before setting the local target thickness by calculating a before-processing representative value, which is a representative value of thicknesses of the material to be etched, based on thicknesses of the material to be etched at a plurality of positions and subtracting a target thickness of the material to be etched after etching from the before-processing representative value.

8. The semiconductor device manufacturing method according to claim 7, wherein the plurality of positions are on a straight line passing through a center of the semiconductor wafer.

9. The semiconductor device manufacturing method according to claim 6, wherein the plurality of positions include the end point detection position and a symmetric position which is symmetric to the end point detection position about a center of the semiconductor wafer.

10. The semiconductor device manufacturing method according to claim 7, wherein at least any one of maximum value, minimum value, mean, and standard deviation is determined for thicknesses of the material to be etched measured at a plurality of positions in or before setting the local target thickness and thicknesses of the material to be etched measured at a plurality of positions after the etching, or difference values therebetween at a plurality of positions.

11. The semiconductor device manufacturing method according to claim 7, wherein when the before-processing representative value is calculated, thicknesses of the material to be etched are weighted according to a distance from a center of the semiconductor wafer.

12. The semiconductor device manufacturing method according to claim 1, wherein after the etching, thicknesses of the material to be etched are measured at a plurality of positions, an after-processing representative value of thicknesses of the material to be etched is calculated based on the measured thicknesses, and a difference between the after-processing representative value and a target thickness of the material to be etched after etching is determined.

* * * * *